United States Patent
Sato

(10) Patent No.: US 10,283,643 B2
(45) Date of Patent: May 7, 2019

(54) DISPLAY DEVICE

(71) Applicant: Japan Display Inc., Minato-ku (JP)

(72) Inventor: Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/544,117

(22) PCT Filed: Jan. 20, 2016

(86) PCT No.: PCT/JP2016/051586
§ 371 (c)(1),
(2) Date: Jul. 17, 2017

(87) PCT Pub. No.: WO2016/117609
PCT Pub. Date: Jul. 28, 2016

(65) Prior Publication Data
US 2018/0013007 A1    Jan. 11, 2018

(30) Foreign Application Priority Data

Jan. 21, 2015  (JP) ................. 2015-009212

(51) Int. Cl.
*H01L 29/786* (2006.01)
*H01L 29/423* (2006.01)
(Continued)

(52) U.S. Cl.
CPC ...... *H01L 29/78612* (2013.01); *H01L 27/124* (2013.01); *H01L 27/1255* (2013.01);
(Continued)

(58) Field of Classification Search
CPC ............. H01L 27/1214; H01L 27/1251; H01L 27/3244–27/3297; H01L 29/4908;
(Continued)

(56) References Cited

U.S. PATENT DOCUMENTS

2011/0193077 A1  8/2011  Yamazaki
2016/0149052 A1*  5/2016  Ahn .................. H01L 29/78648
                                                            257/40

FOREIGN PATENT DOCUMENTS

JP    05-114732 A    5/1993
JP    2008-151900 A   7/2008
(Continued)

OTHER PUBLICATIONS

Office Action dated Apr. 17, 2018 in Korean Patent Application No. 10-2017-7020006 (with English language translation) citing references AO—AR therein, 17 pages.
(Continued)

*Primary Examiner* — Cuong B Nguyen
(74) *Attorney, Agent, or Firm* — Oblon, McClelland, Maier & Neustadt, L.L.P.

(57) ABSTRACT

The purpose of the invention is suppressing a kink phenomenon and improving the image quality of a display device. The display device has a TFT in a pixel. The TFT has a semiconductor layer, a first insulating layer under the semiconductor layer, a second insulating layer over the semiconductor layer, and a gate electrode facing the semiconductor layer with a gap. The gate electrode has a first gate electrode portion facing a lower surface of the semiconductor layer, a second gate electrode portion facing an upper surface of the semiconductor layer, and a third gate electrode portion facing a lateral surface of the semiconductor layer and connected to the first and second gate electrode portions. A laminated part where the first and second insulating layers are stacked is around the semiconductor layer, and a part of the laminated part is between the lateral surface and the third gate electrode portion.

20 Claims, 21 Drawing Sheets

(51) Int. Cl.
*H01L 29/49* (2006.01)
*H01L 51/50* (2006.01)
*H01L 27/12* (2006.01)
*G09G 3/3208* (2016.01)
*H01L 27/32* (2006.01)
*G02F 1/1362* (2006.01)
*G09G 3/3233* (2016.01)
*G02F 1/1368* (2006.01)

(52) U.S. Cl.
CPC ...... *H01L 29/423* (2013.01); *H01L 29/42384* (2013.01); *H01L 29/49* (2013.01); *H01L 29/78648* (2013.01); *H01L 29/78696* (2013.01); *H01L 51/50* (2013.01); *G02F 1/13624* (2013.01); *G02F 2001/13685* (2013.01); *G09G 3/3208* (2013.01); *G09G 3/3233* (2013.01); *G09G 2300/0842* (2013.01); *H01L 27/3262* (2013.01)

(58) Field of Classification Search
CPC .. H01L 51/0508–51/0533; H01L 2924/13069; H01L 29/41733; H01L 29/42384; H01L 29/66265; H01L 29/66742–29/6675; H01L 29/7317; H01L 29/786
See application file for complete search history.

(56) References Cited

FOREIGN PATENT DOCUMENTS

| | | |
|---|---|---|
| JP | 2009-043748 A | 2/2009 |
| JP | 2009-122253 A | 6/2009 |
| JP | 2011-181913 A | 9/2011 |
| JP | 2014-27209 A | 2/2014 |
| KR | 2001-0015311 A | 2/2001 |
| KR | 10-2011-0037220 A | 4/2011 |
| KR | 10-2014-0143108 A | 12/2014 |

OTHER PUBLICATIONS

International Search Report dated Apr. 19, 2016 in PCT/JP2016/051586 (with English language translation).
International Preliminary Report on Patentability and Written Opinion dated Aug. 3, 2017 in PCT/JP2016/051586 (with English language translation).
Office Action dated Oct. 2, 2018 in Japanese Patent Application No. 2015-009212, citing document AO therein, 11 pages (with English language translation).
Office Action dated Feb. 2, 2019 in Chinese Application No. 201680006616.7, along with a computer-generated English translation.

* cited by examiner

DISPLAY DEVICE

TECHNICAL FIELD

The present invention relates to a display device.

BACKGROUND ART

There has been widely used a display device, such as a liquid crystal display device or an organic EL display device, that includes pixels having thin film transistors.

Patent Literature 1 discloses a thin film transistor having a back-gate electrode formed under a semiconductor layer and a front-gate electrode formed over the semiconductor layer. Patent Literature 2 discloses a thin film transistor having a gate electrode formed above a semiconductor thin film and a back-gate electrode formed below the semiconductor thin film.

CITATION LIST

Patent Literature

Patent Literature 1: Japanese Patent Laid-open Publication No. JP2009-043748A
Patent Literature 2: Japanese Patent Laid-open Publication No. JPH05-114732A

SUMMARY OF INVENTION

Technical Problem

A recent requirement for a display device to be adapted to high resolution leads to size reduction of a pixel. A pixel in a smaller size leads to reduction in the space for a thin film transistor. This results in more likely occurrence of kink phenomenon that becomes a problem in controlling a current in a transistor in a small size. A kink phenomenon is a phenomenon in which Vd-Id characteristics become different from those of a typical thin film transistor, and is referred to also as an impact ion phenomenon in which a huge amount of hot electrons are generated in an intense electric field at a drain terminal. When these excessive holes are accumulated under a gate, thus resulting in a hole accumulation state, that is, when a kink phenomenon occurs, characteristics of a thin film transistor vary more largely. This may deteriorate image quality.

The present invention has been conceived in view of the above, and aims to provide a technique for reducing occurrence of kink phenomenon in a thin film transistor to thereby improve image quality of a display device.

Solution to Problem

Representative one of the inventions disclosed in this application will be briefly outlined below.

A display device includes thin film transistors each provided to each of a plurality of pixels arranged in a matrix. Each of the thin film transistors includes a semiconductor layer, a first insulating layer formed under the semiconductor layer, a second insulating layer formed over the semiconductor layer, and a gate electrode opposed to the semiconductor layer and separated from the semiconductor layer. The semiconductor layer includes a source region, a drain region, a channel region between the source region and the drain region, an upper surface, a lower surface, and a lateral surface connected to the upper surface and the lower surface and having a part contained in the channel region. The gate electrode includes a first gate electrode portion opposed to the lower surface of the semiconductor layer via the first insulating layer, a second gate electrode portion opposed to the upper surface of the semiconductor layer via the second insulating layer, and a third gate electrode portion opposed to the lateral surface of the semiconductor layer, and contacting the first gate electrode portion and the second gate electrode portion. A laminated part where the first insulating layer and the second insulating layer are stacked each other is located around the semiconductor layer, and a part of the laminated part is positioned between the lateral surface of the semiconductor layer and the third gate electrode portion.

Advantageous Effects of Invention

The present invention can reduce occurrence of kink phenomenon and thereby improve image quality of a display device.

DESCRIPTION OF EMBODIMENTS

Figure 1:
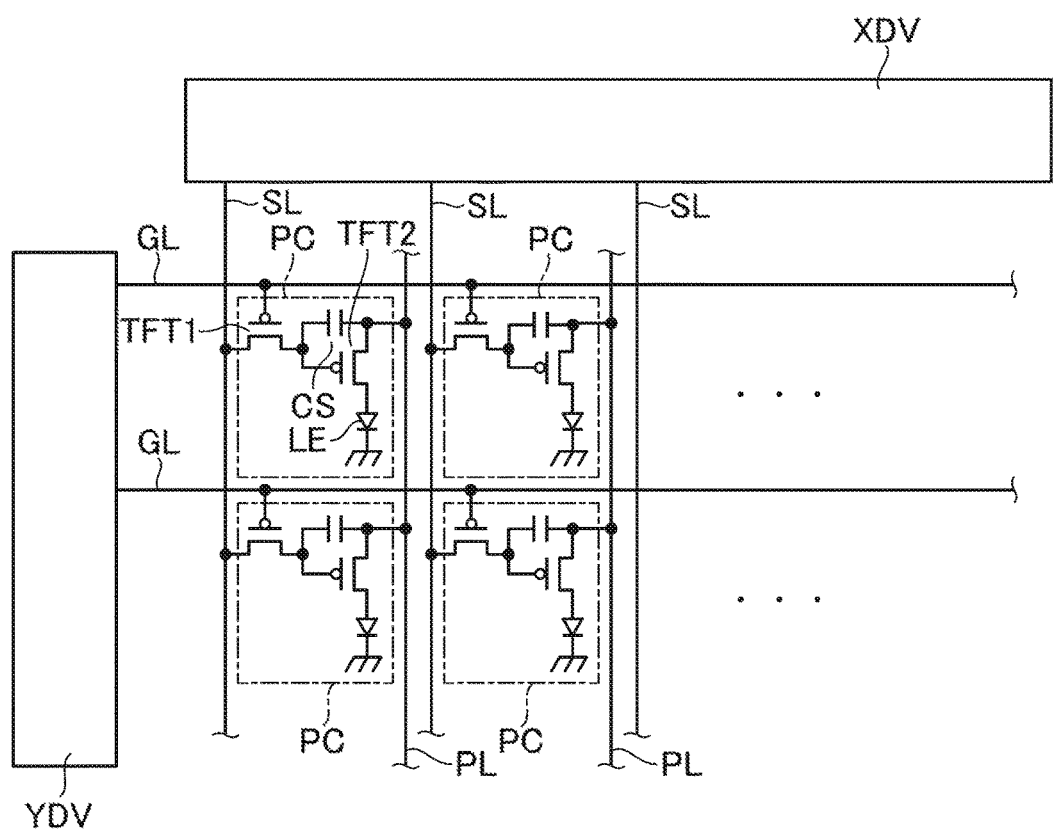
FIG. 1 is a circuit diagram illustrating one example of an equivalent, circuit of an organic EL display device according to a first embodiment.

The following describes embodiments of the present invention, based on the drawings. Structural components mentioned below having the same function are given the same reference characters, and a duplicate description is avoided. Although an example in which the present invention is applied to an organic Electro Luminescence (EL) display device, or one type of a display device, will be descried below as an embodiment of the present invention, the display device may be any other type of display device having a pixel circuit including a thin film transistor, such as a liquid crystal display device.

First Embodiment

An organic EL display device according to a first embodiment of the present invention includes an array substrate SUB (see FIG. 3), an opposed substrate opposed to the array substrate SUB, a flexible circuit board connected to the array substrate SUB, and a driver integrated circuit. The opposed substrate has a color filter formed thereon. Combination of the color filter and a white organic light emitting diode (OLED) achieves full color display. The white OLED may be substituted by light emitting elements that emit light in respective colors, such as RGS. In this case, the opposed substrate and the color filter are omissible.

FIG. 1 is a circuit diagram illustrating one example of an equivalent circuit of an organic EL display device according to the first embodiment. Physically, the circuit illustrated in FIG. 1 is formed on the array substrate SUB (see FIG. 3) or in the driver integrated circuit. A plurality of pixel circuits PC, a plurality of gate signal lines GL, a plurality of data signal lines SL, and a power supply line PL are disposed on the array substrate SUB. The plurality of pixel circuits PC are arranged in a matrix in the display area of the array substrate SUB. Each pixel circuit PC corresponds to each display pixel. A single gate signal line GL is provided to each row of the pixel circuits PC, and each gate signal line GL is connected to the pixel circuits PC constituting the corresponding row. Meanwhile, a single data signal line SL is provided to each column of the pixel circuits PC, and each data signal line SL is connected to the pixel circuits PC constituting the corresponding column. One ends of the plurality of gate signal lines GL are connected to a drive circuit YDV, and one ends of the plurality of data signal lines SL are connected to a drive circuit XDV. The drive circuit YDV outputs a scan signal to the gate signal line GL, while the drive circuit XDV supplies an electric potential of a video signal in accordance with a display tone level of a pixel to the data signal line SL.

Each pixel circuit PC includes a thin film transistor TFT1, a thin film transistor TFT2, a capacitor CS, and a light emitting element LE. The thin film transistor TFT1 is turned on in response to a scan signal supplied from the gate signal line GL, and stores an electric potential in the capacitor CS based on the video signal supplied from the data signal line SL. Meanwhile, the thin film transistor TFT2 controls the amount of current flowing across the source and drain, based on the electric potential difference stored in the capacitor CS. The light emitting element LE is an OLED, and emits light with an intensity in accordance with the amount of current controlled by the thin film transistor TFT2. As the thin film transistor TFT2 is of a P channel type, the source electrode of the thin film transistor TFT2 is connected to the power supply line PL, and the drain electrode of the same is connected to the light emitting element LE. The capacitor CS is provided between the gate electrode and the source electrode of the thin film transistor TFT2. Note that the pixel circuit PC is not limited to the one illustrated in FIG. 1, and may be a pixel circuit PC in which the thin film transistor TFT2 controls the voltage applied to the light emitting element LE.

Figure 2:
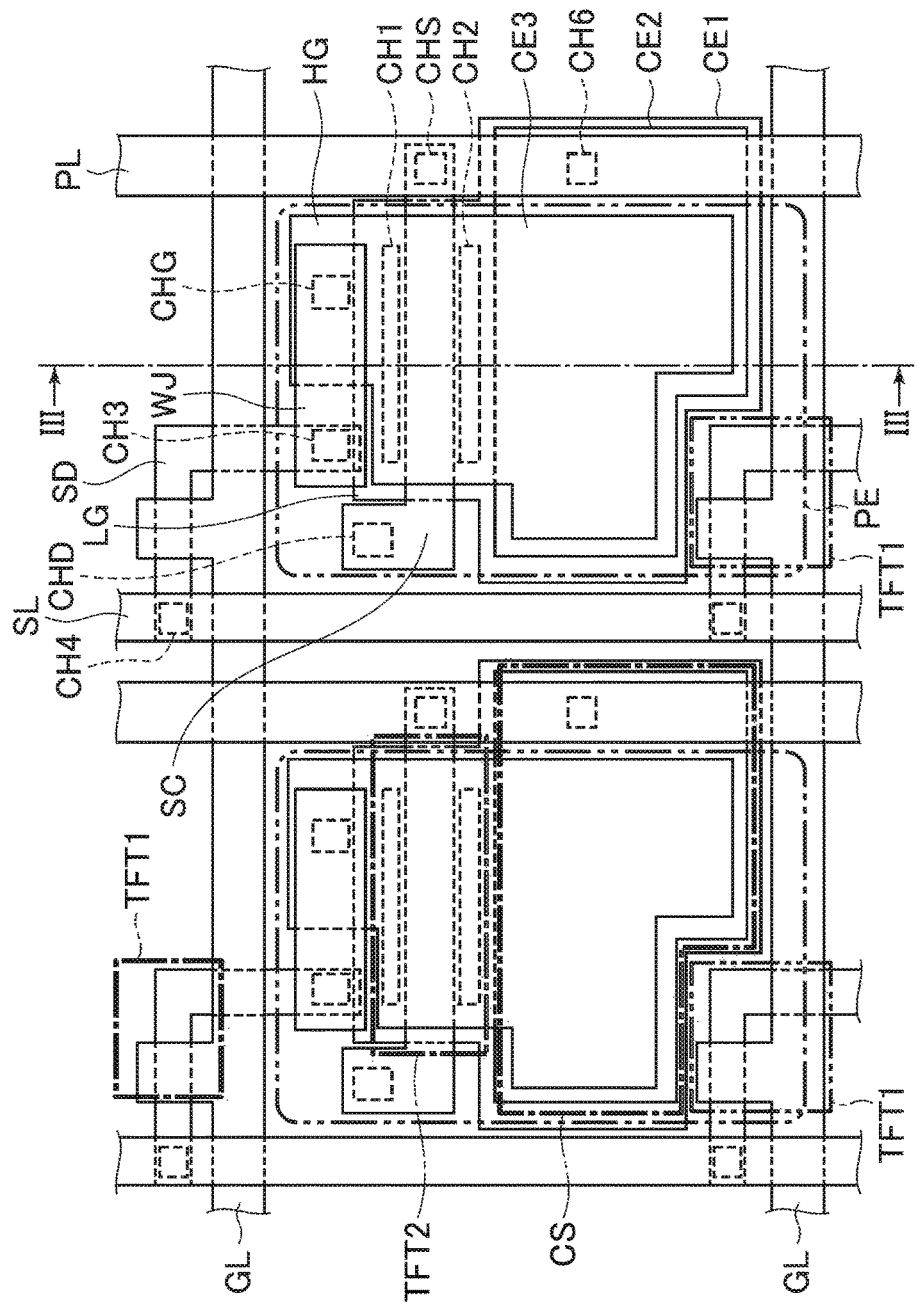
FIG. 2 is a plan view of one example of a pixel circuit according to the first embodiment.
Figure 3:
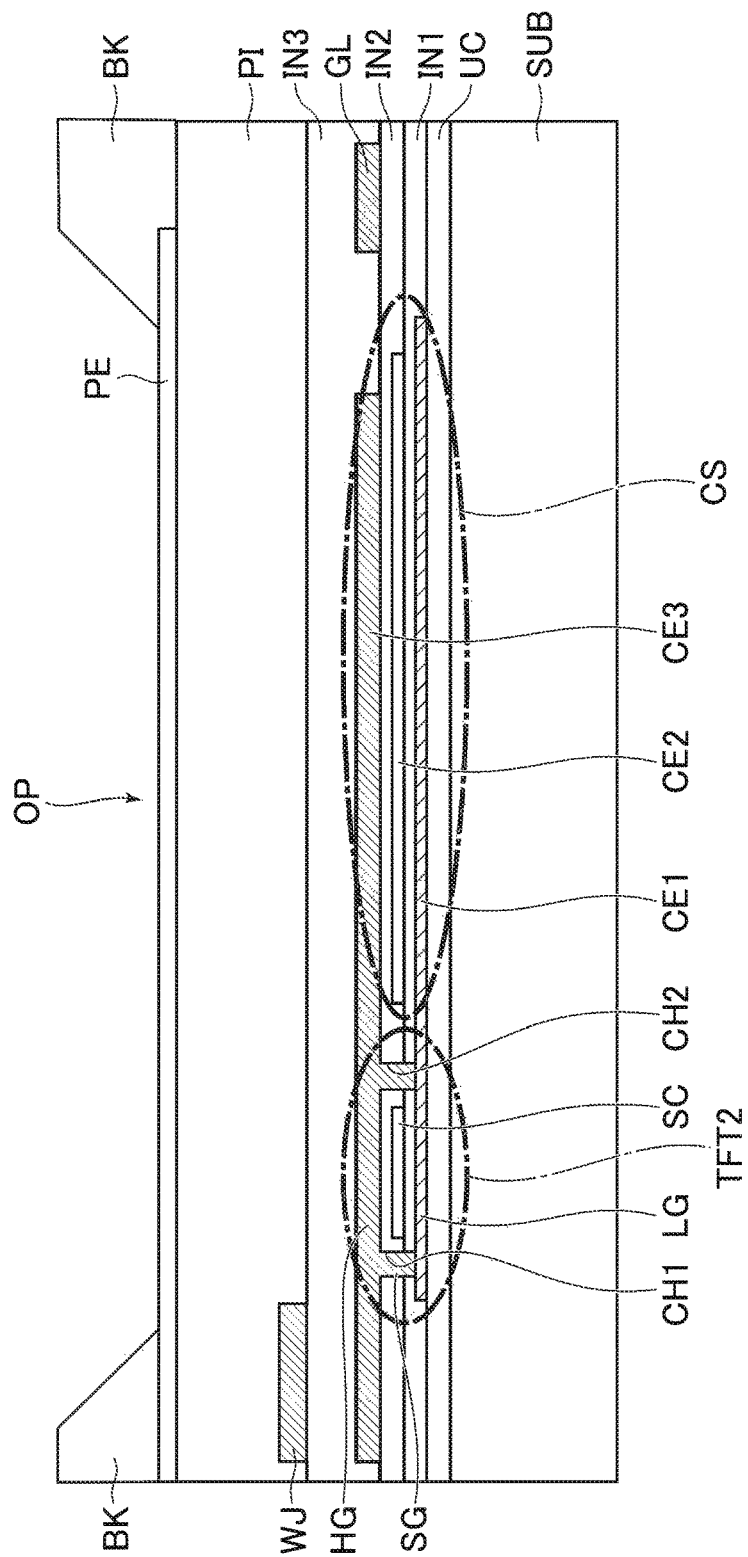
FIG. 3 is a cross sectional view of the pixel circuit illustrated in FIG. 2 along the III-III cross sectional line.

FIG. 2 is a plan view of one example of the pixel circuit PC according to the first embodiment. FIG. 3 is a cross sectional view of the pixel circuit PC illustrated in FIG. 2 along the III-III cross sectional line. Each pixel circuit PC is arranged in an area surrounded mainly by adjacent data signal lines SL and adjacent gate signal lines GL. Each of the power supply lines PL is located to the left of, and adjacent to, a corresponding data signal line SL, and extends in the up-down direction. In the area on the array substrate SUB where the pixel circuit PC is formed, channel semiconductor films SC, SD, an upper gate electrode HG, a lower gate electrode LG, a side gate electrode SG (see FIG. 3), a first capacitor electrode CE1, a second capacitor electrode CE2, a third capacitor electrode CE3, an anode PE, and a bank BK having a bank opening OP formed therein as illustrated in FIG. 3 are formed as components constituting the pixel circuit PC. The channel semiconductor film SD and a part of the gate signal line GL, the part positioned over the channel semiconductor film SD together constitute the thin film transistor TFT1. The channel semiconductor film SC, the upper gate electrode HG, the lower gate electrode LG, and the side gate electrode SG (see FIG. 3) constitute the thin film transistor TFT2. The first capacitor electrode CE1, the second capacitor electrode CE2, and the third capacitor electrode CE3 together constitute the capacitor CS. One electrode of the capacitor CS corresponds to the second capacitor electrode CE2, and other electrode of the same correspond to the first capacitor electrode CE1 and the third capacitor electrode CE3. The first capacitor electrode CE1 is formed integrally with the lower gate electrode LG. The second capacitor electrode CE2 is electrically connected to the channel semiconductor film SC via the power supply line PL. The third capacitor electrode CE3 is formed integrally with the upper gate electrode HG.

As illustrated in FIG. 3, an undercoat UC, a first conductive layer to be described later, a first gate insulating layer IN1, a semiconductor layer to be described later, a second gate insulating layer IN2, a second conductive layer to be described layer, an interlayer insulating layer IN3, a third conductive layer to be described later, a planarization layer PI, a layer containing the anode PE, and a layer containing the bank BK are sequentially stacked in this order on the array substrate SUB. Additionally, layers such as an OLED layer, a layer for a cathode, and a sealing layer (all not shown) are formed on the layer containing the bank BK. A part without a bank BK will be referred to as a bank opening OP. In the bank opening OP, the anode PE is exposed from the bank BK. The first conductive layer includes the lower gate electrode LG and the first capacitor electrode CE1. The semiconductor layer includes the channel semiconductor film SC, the channel semiconductor film SD (see FIG. 2), and the second capacitor electrode CE2. The second conductive layer includes the gate signal line GL, the upper gate electrode HG, and the third capacitor electrode CE3. The second conductive layer additionally includes the side gate electrode SG made of conductive material filled in the contact holes CH1, CH2. The third conductive layer includes a lump wire WJ, the power supply line PL (see FIG. 2), and the data signal line SL (see FIG. 2). The OLED layer (not shown) contacts the anode PE in the bank opening OP. The area where the OLED layer contacts the anode PE is an area where an organic EL element emits light.

The channel semiconductor film SD is connected to the data signal line SL through a contact hole CH4 at a position shown above the gate signal line GL shown on the upper side of FIG. 2, when viewed from the middle of the pixel circuit PC. Specifically, the channel semiconductor film SD extends rightward in FIG. 2 from the position of the contact hole CH4 and then under a part (a part extending upward) of the gate signal line GL before bending downward to extend under the gate signal line GL to reach a position corresponding to a contact hole CH3 formed in an upper layer.

The channel semiconductor film SC extends in the lateral direction in a position slightly above the middle of the pixel circuit PC in FIG. 2. The right end portion of the channel semiconductor film SC is connected to the power supply line PL through a contact hole CHS, while the left end portion of the same slightly bends upward with the tip end thereof connected to the anode PE through a contact hole CHD. The lower gate electrode LG and the upper gate electrode HG overlap, in a plan view, a part of the channel semiconductor film SC, the part extending in the lateral direction, excluding the end portions thereof. The lower gate electrode LG is connected to the upper gate electrode HG via the side gate electrode SG which is lateral to the channel semiconductor film SC and which is positioned in a direction perpendicular to the direction in which the channel semiconductor film SC extends (see FIG. 3). The side gate electrode SG is formed mainly in each contact hole CH1, CH2. The upper gate electrode HG projects upward from a position, in FIG. 2, above the contact hole CH1 shown on the upper side of FIG. 2, when viewed from the channel semiconductor film SC. The projecting part is connected to the jump wire WJ formed in an upper layer through a contact hole CHG. The jump wire WJ is connected to the channel semiconductor film SD through the contact hole CH3.

The first capacitor electrode CE1 has a rectangular shape extending upward from the lower edge of the pixel circuit PC (see FIG. 1) in FIG. 2 and having a cut-out formed at a position corresponding to an area where the thin film transistor TFT1 is formed. The first capacitor electrode CE1 is integrated with the lower gate electrode LG in a position lower than the contact hole CH2 in FIG. 2. The second capacitor electrode CE2 is provided opposed to, and overlapping in a plan view, the first capacitor electrode CE1. And in FIG. 2, the second capacitor electrode CE2 extends from a position slightly above the lower edge of the first capacitor electrode CE1 to a position slightly below the contact hole CH2. The second capacitor electrode CE2 is connected to the power supply line PL through a contact hole CH6. This establishes electrical connection between the source of the thin film transistor TFT2 and the second capacitor electrode CE2 via the power supply line PL. Alternatively, the second capacitor electrode CE2 may be directly connected to the end portion of the channel semiconductor film SC on the source side. In FIG. 2, the third capacitor electrode CE3 extends upward from a position slightly above the lower edge of the second capacitor electrode CE2. The third capacitor electrode CE3 has a rectangular shape having a cut-out formed at a position corresponding to an area where the thin film transistor TFT1 is formed. The upper gate electrode HG is integrated with the third capacitor electrode CE3 at a position lower than the contact hole CH2 in FIG. 2. The first capacitor electrode CE1 is electrically connected to the second capacitor electrode CE2 via the side gate electrode SG (see FIG. 3). This constitutes the sandwich structure of the capacitor CS with a larger capacitance than that of a structure in which two electrodes are simply opposed to each other.

Figure 4:
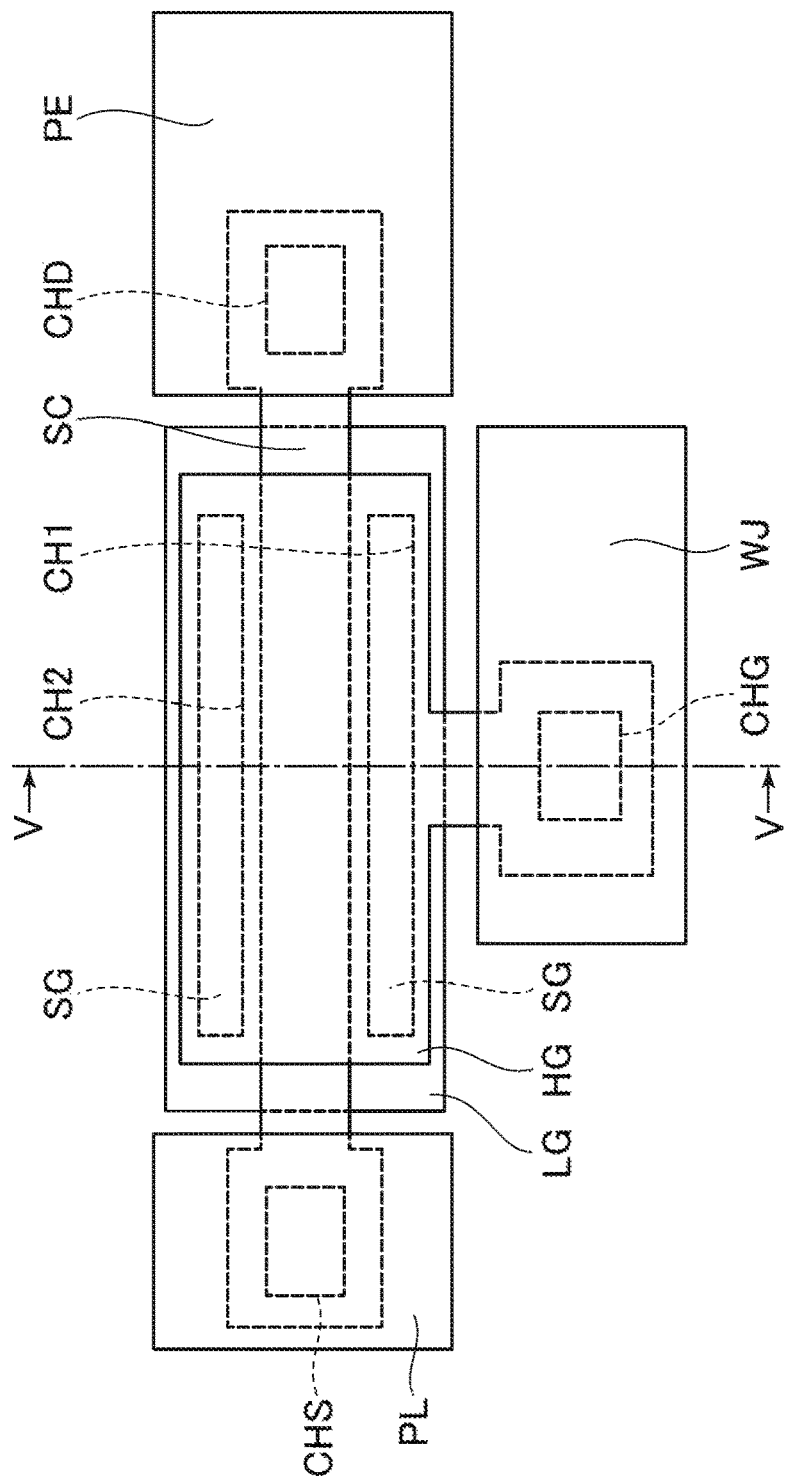
FIG. 4 is a plan view of one example of a thin film transistor according to the first embodiment.
Figure 5:
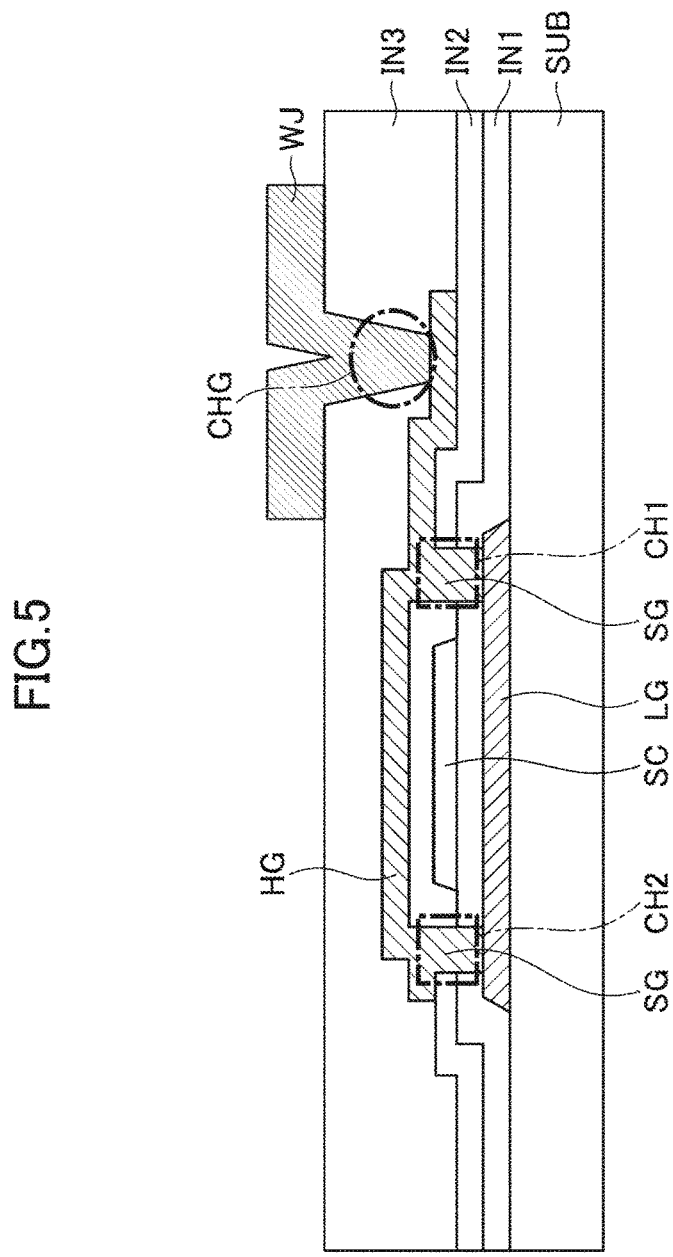
FIG. 5 is a cross sectional view of the thin film transistor illustrated in FIG. 4 along the V-V cross sectional line.

The following describes in detail the structure of the thin film transistor TFT2. FIG. 4 is a plan view of one example of the thin film transistor TFT2 according to the first embodiment. FIG. 5 is a cross sectional view of the thin film transistor TFT2 illustrated in FIG. 4 along the V-V cross sectional line. FIGS. 4 and 5 illustrate the thin film transistor TFT2 alone without the electrodes constituting the capacitor CS. The undercoat UC is not shown in FIG. 5.

The channel semiconductor film SC extends from the drain terminal in contact with the anode PE through the contact hole CHD to the source terminal in contact with the power supply line PL through the contact hole CHS. The channel part between the source terminal and the drain terminal has a band shape in a plan view. As to the part between the source to drain terminals of the channel semiconductor film SC, a part overlapping in a plan view either the lower gate electrode LG or the upper gate electrode HG will be hereinafter referred to as a channel region, a part closer to the drain terminal side than the channel region as a drain region, and a part closer to the source terminal side than the channel region as a source region.

The lower gate electrode LG, the upper gate electrode HG, and the side gate electrode SG together constitute a gate electrode of the thin film transistor TFT2. The lower gate electrode LG is positioned below and opposed to the channel semiconductor film SC via the gate insulating layer IN1. The upper gate electrode HG is positioned above and opposed to the channel semiconductor film SC via the gate insulating layer IN2. The side gate electrode SG is lateral to the channel semiconductor film SC and positioned in a direction (hereinafter referred to as the "width direction") perpendicular to the direction in which the channel semiconductor film SC extends from the source region to the drain region and opposed to the channel semiconductor film SC. The side gate electrode SG connects the lower gate electrode LG and the upper gate electrode HG. The direction in which the channel semiconductor film SC extends from the source region to the drain region is the direction between the source region and the drain region relative to the channel semiconductor film SC, and will be hereinafter referred to also as "the direction in which the channel semiconductor film SC extends".

Note here that there is a part without a semiconductor formed between the gate insulating layer IN1 and the gate insulating layer IN2, where the gate insulating layer IN1 and the gate insulating layer IN2 are stacked directly one on the other. This part will be referred to as a laminated part. In the laminated part, the upper surface of the gate insulating layer IN1 contacts the lower surface of the gate insulating layer IN2. A part of the laminated part intervenes between the channel semiconductor film SC and the side gate electrode SG to prevent electrical connection between the channel semiconductor film SC and the side gate electrode SG.

The channel region of the channel semiconductor film SC includes an overlap opposed area opposed to both of the lower gate electrode LG and the upper gate electrode HG, and a one-side opposed area opposed to either one of the lower gate electrode LG and the upper gate electrode HG. The one-side opposed area is present on each of the both respective sides of the overlap opposed area in the direction in which the channel semiconductor film SC extends. In a different point of view, in a plan view, the respective both ends of the channel semiconductor film SC in the direction between the source region and the drain region (respective ends on the source and drain region sides) project from the upper gate electrode HG and the lower gate electrode LG. Moreover, in a plan view, the first position where the channel semiconductor film SC projects from the lower gate electrode LG is displaced from the second position where the channel semiconductor film SC projects from the upper gate electrode HG. In the example illustrated in FIGS. 4 and 5, the first position is located more outward than the second position in the direction in which the channel semiconductor film SC extends, and the length of the lower gate electrode LG in that direction is longer than the length of the upper gate electrode HG in that direction. In a plan view, the lower gate electrode LG has a size larger than the size of a part opposed to the entire higher gate electrode HG.

Note here that the relationship between the upper gate electrode HG and the lower gate electrode LG may be different from that in the example illustrated in FIG. 4. For example, the second position is located more outward than the first position in the direction in which the channel semiconductor film SC extends, and the length of the lower gate electrode LG extending in that direction may be shorter than the length of the upper gate electrode HG extending in that direction. In this case, in a plan view, the upper gate electrode HG has a size larger than the size of a part opposed to the entire lower gate electrode LG.

In the laminated part, contact holes CH1, CH2 are formed. The respective contact holes CH1, CH2 are opposed to the respective both sides of the channel semiconductor film SC in the width direction. Specifically, in FIG. 4, the contact hole CH1 is positioned below the channel semiconductor film SC, while the contact hole CH2 is positioned above the channel semiconductor film SC. Each contact hole CH1, CH2 has a long shape continuously extending along the channel semiconductor film SC, and penetrates the laminated part. The length of each contact hole CH1, CH2 in the direction in which the channel semiconductor film SC extends is shorter than the length of the upper gate electrode HG, so that the respective ends of the contact hole CH1, CH2 are positioned inside the respective ends of the upper gate electrode HG (a smaller one of the lower gate electrode LG and the upper gate electrode HG) in a plan view. Strictly speaking, when assuming that an area of the lower gate electrode LG that is opposed to the channel semiconductor film SC is defined as a first area, an area of the upper gate electrode HG that is opposed to the channel semiconductor film SC as a second area, and an area of the side gate electrode SG that is opposed to the channel semiconductor film SC as a third area, the respective both ends of the third area in the direction in which the channel semiconductor film. SC extends are positioned, inside the first and second areas. The side gate electrode SG is formed in each contact hole CH1, CH2. Specifically, the side gate electrode SG is formed by filling the metal forming the second conductive layer in each contact hole CH1, CH2 when forming the second conductive layer containing the upper gate electrode HG. Thus, the side gate electrodes SG are opposed to the respective both sides of the channel semiconductor film SC in the width direction.

As a result of the above, gate electrodes are present above and below the channel semiconductor film SC and in the width direction of the same. Such presence of the gate electrodes allows driving of the thin film transistor TFT2 at a lower voltage, as compared with a case in which a gate electrode is absent in the width direction. Reduction of the drive voltage can reduce occurrence of kink phenomenon.

Figure 6:
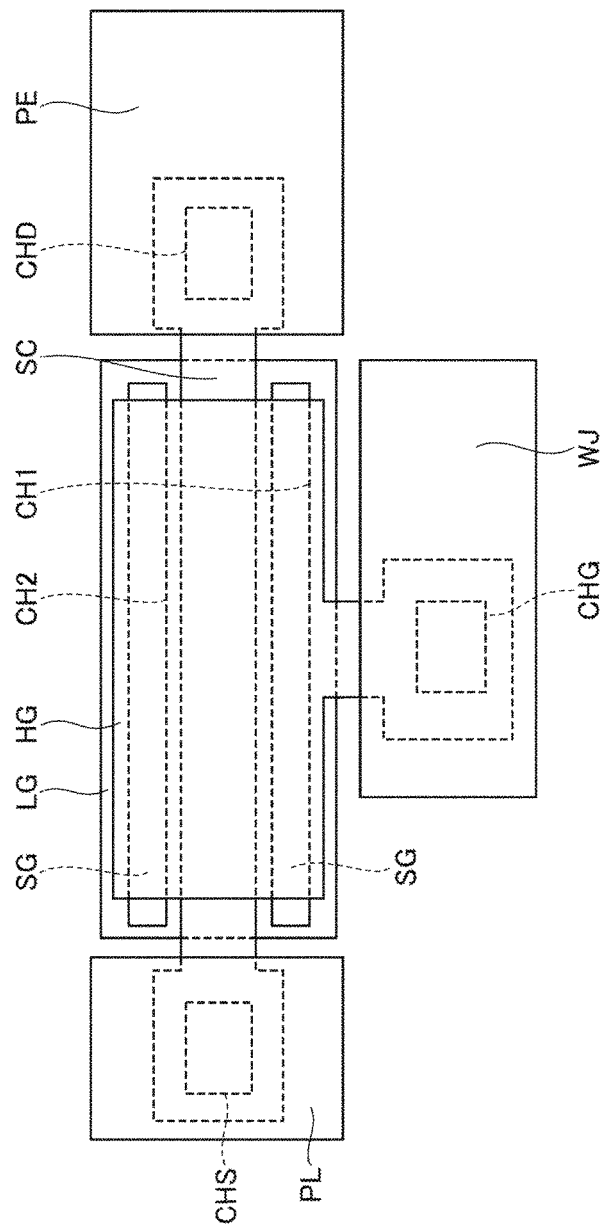
FIG. 6 is a plan view of another example of the thin film transistor.

Note that the shape of the thin film transistor TFT2 may be different from the above described. FIG. 6 is a plan view of another example of the thin film transistor TFT2. The order of the respective layers constituting the thin film transistor TFT2 illustrated in FIG. 6 is similar to that in the example illustrated in FIG. 5 and also in other examples and embodiments described below unless otherwise stated. In the example illustrated in FIG. 6, in the direction in which the channel semiconductor film SC extends, the respective both ends of each contact hole CH1, CH2 are positioned outside the respective ends of one of the lower gate electrode LG and the upper gate electrode, and inside the respective ends of the other, different from the example illustrated in FIG. 4. The side gate electrode SG may be formed in an area where the upper gate electrode HG overlaps each contact hole CH1, CH2 in a plan view, or in the entire area of each contact hole CH1, CH2. The structure illustrated in FIG. 6 allows the side gate electrode SG to be longer. A longer side gate electrode SG enables driving at a much lower drive voltage than that in the example illustrated in FIG. 4, and thus to reduce occurrence of kink phenomenon.

Figure 7:
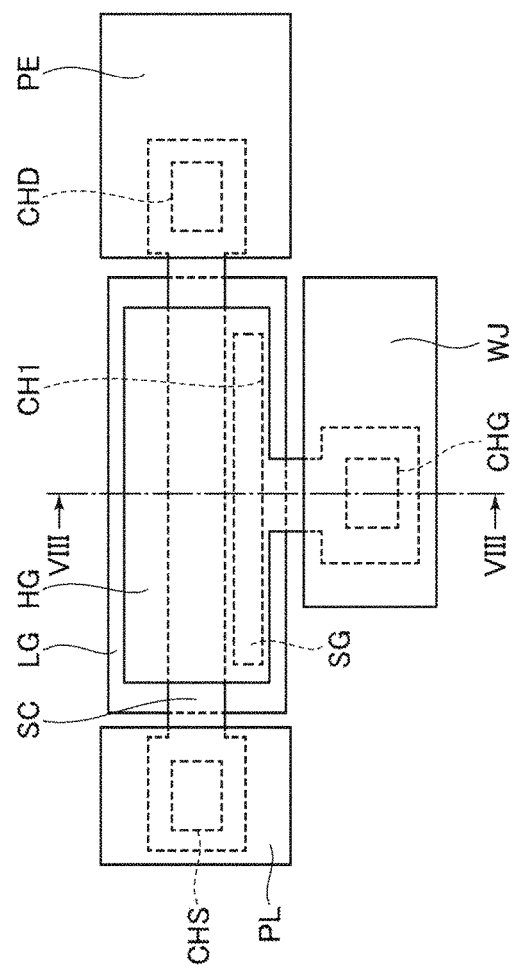
FIG. 7 is a plan view of another example of the thin film transistor.
Figure 8:
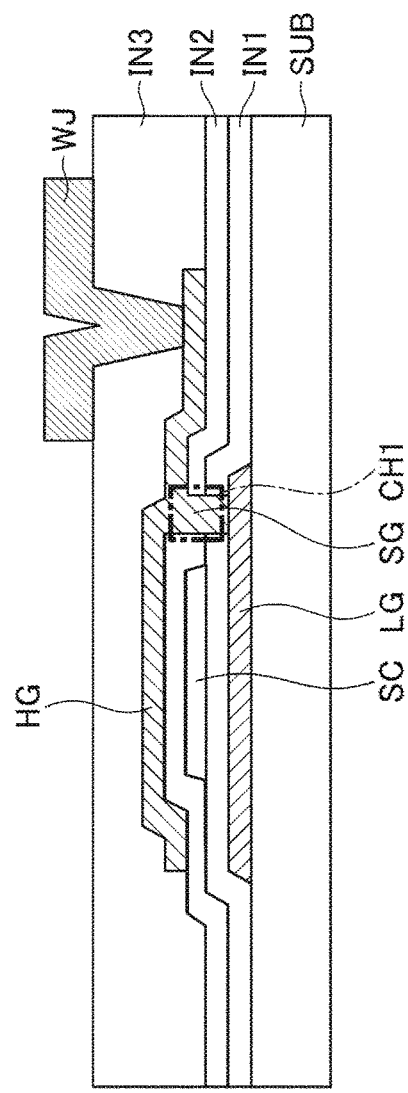
FIG. 8 is a cross sectional view of the thin film transistor illustrated in FIG. 7 along the VIII-VIII cross sectional line.

The side gate electrode SG formed in the thin film transistor TFT2 may be opposed to only one side of the channel semiconductor film SC in the width direction. FIG. 7 is a plan view of another example of the thin film transistor TFT2. FIG. 8 is a cross sectional view of the thin film transistor TFT2 illustrated in FIG. 7 along the VIII-VIII cross sectional line. In the example illustrated in FIGS. 7 and 8, the contact hole CH2 is not formed above the channel semiconductor film SC in FIG. 7 so that the side gate electrode SG is formed only in the contact hole CH1, different from the example illustrated in FIGS. 4 and 5. The structure illustrated in FIGS. 7 and 8 as well is able to reduce occurrence of kink phenomenon. Note that the side gate electrode SG in the contact hole CH2 may be omitted in other examples, as in the example illustrated in FIGS. 7 and 8.

Figure 9:
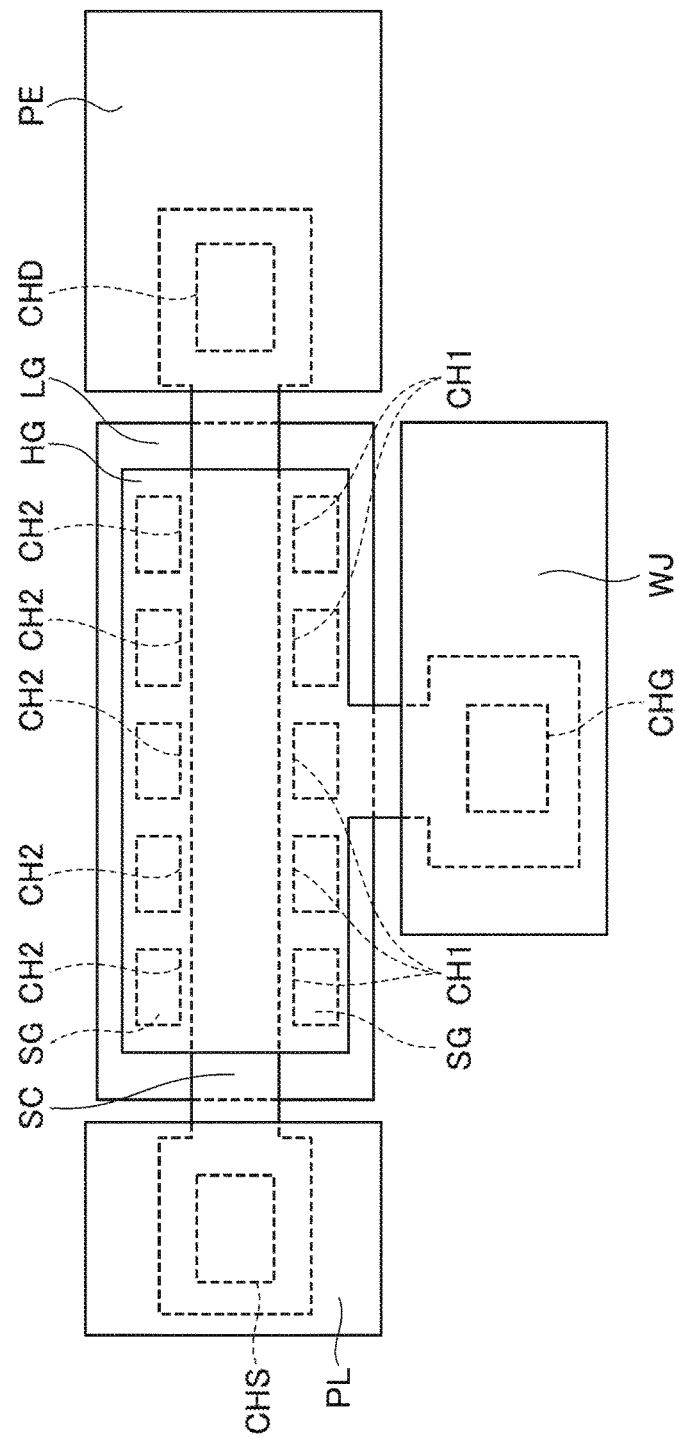
FIG. 9 is a plan view of another example of the thin film transistor.

The side gate electrode SG formed in the thin film transistor TFT2 may not be formed continuous in the direction in which the channel semiconductor film SC extends. FIG. 9 is a plan view of another example of the thin film transistor TFT2. The cross section along the V-V cross sectional line illustrated in FIG. 9 is similar to that illustrated in FIG. 5. In the example illustrated in FIG. 9, the side gate electrode SG includes five parts aligned apart from each other in the direction in which the channel semiconductor film SC extends, different from the example illustrated in FIG. 4. That is, the side gate electrodes SG formed in each contact hole CH1, CH2 is formed intermittently. Each contact hole CH1, CH2 is formed intermittently. Specifically, the side gate electrode SG positioned on one side of the channel semiconductor film SC in the width direction includes a plurality of parts which are aligned in the direction in which the channel semiconductor film SC extends and which are apart from each other. Note that the number of the parts may be different from that illustrated in FIG. 9. Only either one of the contact holes CH1, CH2 may be formed intermittently. At least one of the contact holes CH1, CH2 in other examples may be formed intermittently.

Figure 10:
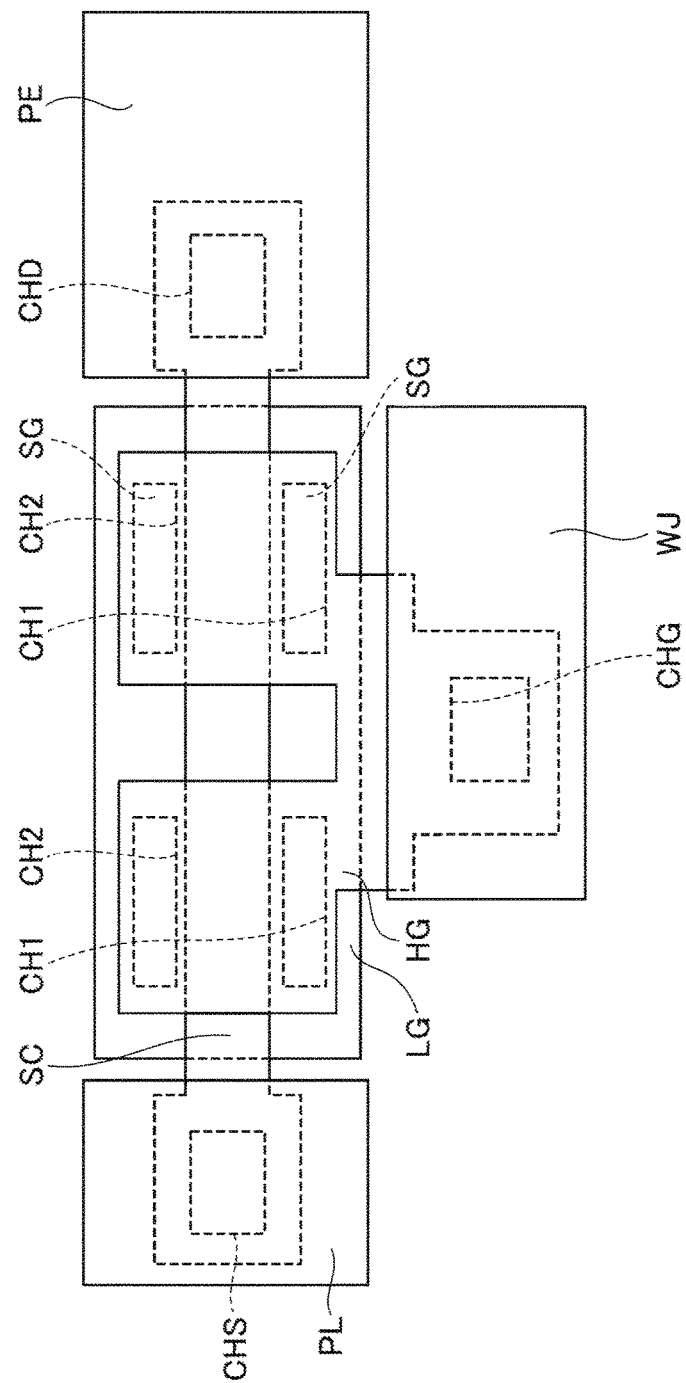
FIG. 10 is a plan view of another example of the thin film transistor.

One of the lower gate electrode LG and the upper gate electrode HG formed in the film transistor TFT2 may have a cut-out. FIG. 10 is a plan view of another example of the thin film transistor TFT2. In the thin film transistor illustrated in FIG. 10, the upper gate electrode HG has a cut-out such that an area thereof opposed to the channel semiconductor film SC is separated in the direction in which the channel semiconductor film SC extends, different from the example illustrated in FIG. 4. That, is, in a plan view, the area of the upper gate electrode HG opposed to the channel semiconductor film SC is divided by the cut-out into a plurality of partial areas aligned in the direction in which the channel semiconductor film SC extends. Specifically, in FIG. 10, the area of the upper gate electrode HG opposed to the channel semiconductor film SC is divided into two partial areas. The respective partial areas are connected to the wire WG through the contact hole CHG via the area shown below the partial areas of the upper gate electrode HG in FIG. 10. A part of the side gate electrode SG is formed on each of the both sides of each partial area in the width direction. The number of the parts of the side gate electrode SG is equal to the number obtained by multiplying the number of the partial areas by two. The respective both ends of each part of the side gate electrode SG are positioned, in the direction in which the channel semiconductor film SC extends, inside the respective both ends of the partial area containing an area opposed to that part. Note that a cut-out may be made in the lower gate electrode LG instead, or may be implemented in other examples.

Second Embodiment

The following describes an organic EL display device according to a second embodiment of the present invention. Specifically, a difference of the organic EL display device according to the second embodiment from that in the first embodiment will be mainly described below.

Figure 11:
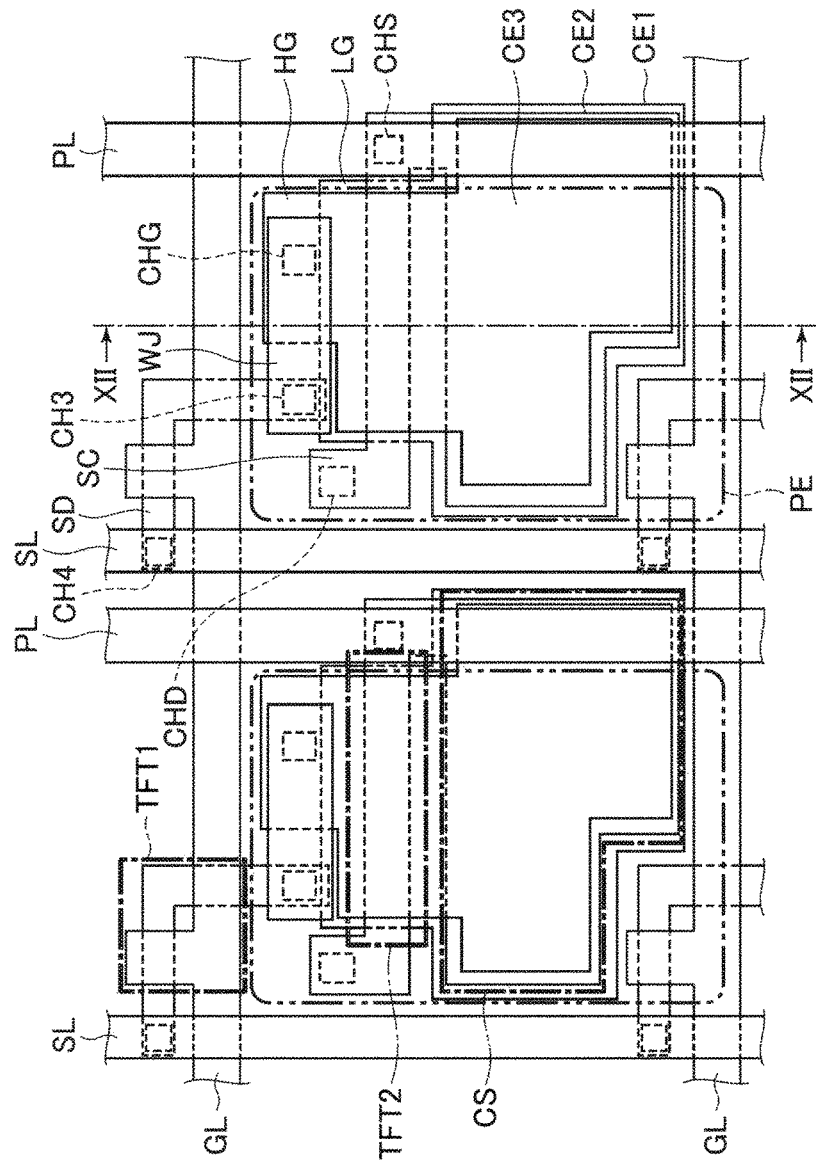
FIG. 11 is a plan view of one example of a pixel circuit according to a second embodiment.
Figure 12:
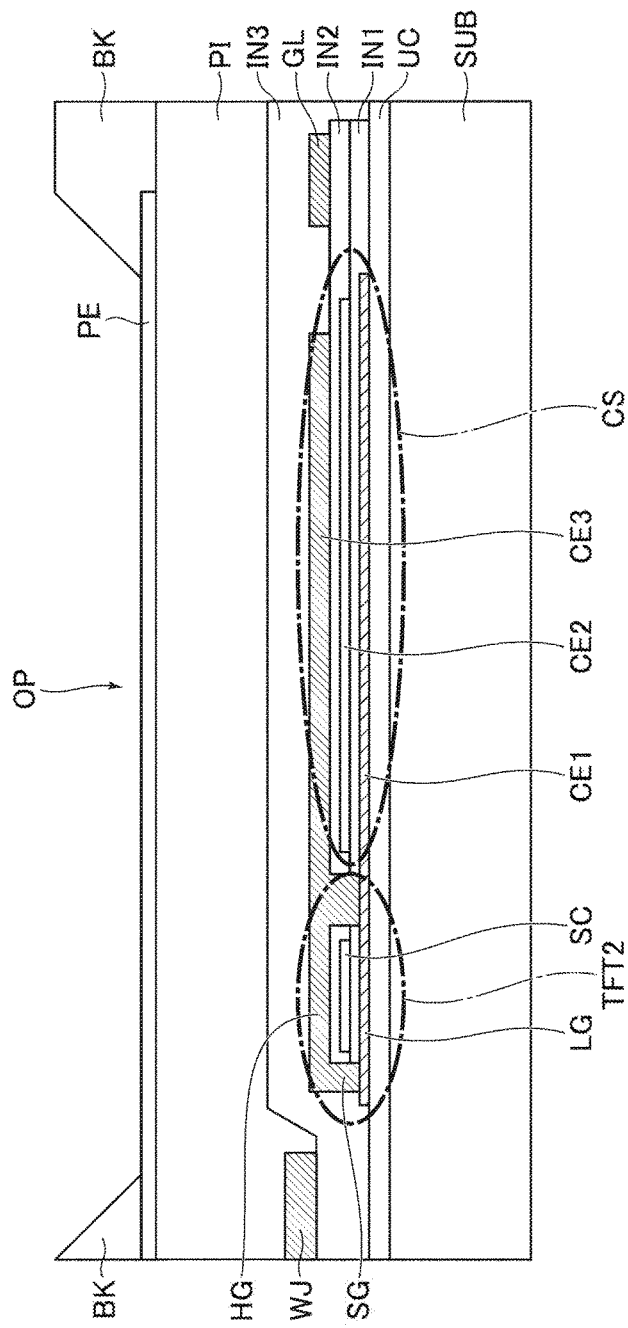
FIG. 12 is a cross sectional view of the pixel circuit illustrated in FIG. 11 along the XII-XII cross sectional line.

FIG. 11 is a plan view of one example of a pixel circuit PC according to the second embodiment. FIG. 12 is a cross sectional view of the pixel circuit PC illustrated in FIG. 11 along the XII-XII cross sectional line. In the plan view of FIG. 11, a significant difference from the first embodiment lies in that the contact holes CH1, CH2 illustrated in FIG. 2 are not formed in FIG. 11. The contact holes CH1, CH2 are not formed because the side gate electrode SG is formed not using the contact holes CH1, CH2. Other differences lie in that the channel semiconductor film SC is connected to the second capacitor electrode CE2 in the same layer in the pixel circuit PC according to the second embodiment.

In FIG. 12, the area where the gate insulating layers IN1, IN2 are formed is different from that in the first embodiment. In the second embodiment, instead of forming a groove of the contact hole CH1, CH2, while the gate insulating layers IN1, IN2 are not removed only in an area where the insulating layers IN1, IN2 are highly necessary, such as in the vicinity of the channel semiconductor film SC and in an area with the capacitor CS formed, a metal film for constituting a second conductive layer is formed so as to cover the lateral surface of the steps at an end of the area with the gate insulating layers IN1, IN2 formed, to thereby form the side gate electrode SG. Further, while the lower gate electrode LG has a projecting area projecting from the gate insulating layers IN1, IN2 in the width direction of the channel semiconductor film SC, the side gate electrode SG is connected to the lower gate electrode LG via the projecting area.

Figure 13:
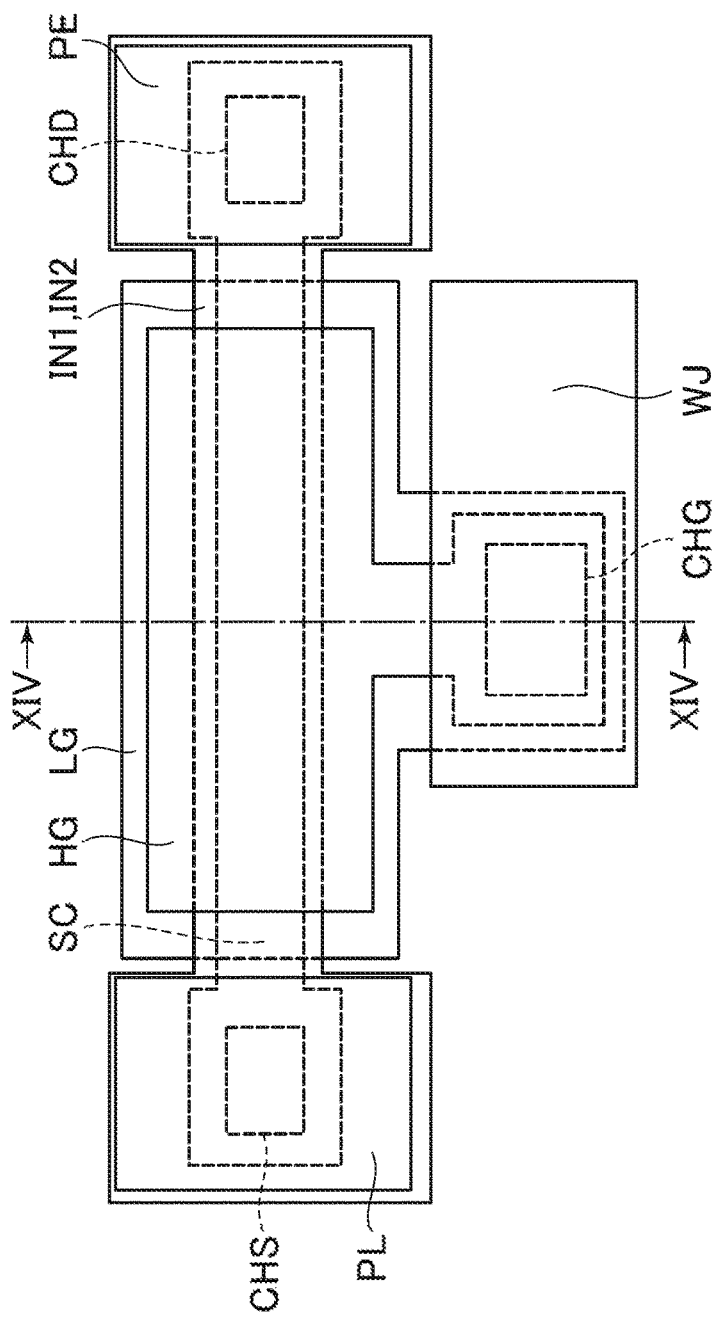
FIG. 13 is a plan view of one example of a thin film transistor according to the second embodiment.
Figure 14:
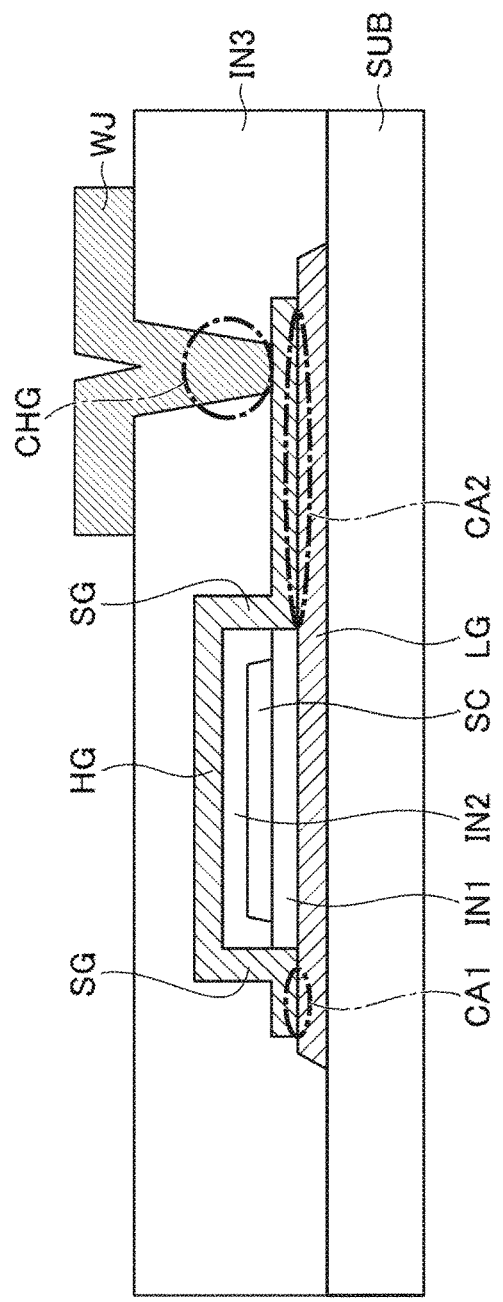
FIG. 14 is a cross sectional view of the thin film transistor illustrated in FIG. 13 along the XIV-XIV cross sectional line.

FIG. 13 is a plan view of one example of the thin film transistor TFT2 according to the second embodiment. FIG. 14 is a cross sectional view of the thin film transistor TFT2 illustrated in FIG. 13 along the XIV-XIV cross sectional line. The thin film transistor TFT2 illustrated in FIGS. 13 and 14 is an example with absence of a capacitor CS, different from the example illustrated in FIGS. 11 and 12, but a capacitor CS may be formed. In FIG. 13, the gate insulating layers IN1, IN2 are illustrated, different from other plan views. In the example illustrated in FIG. 13, the lower gate electrode LG has a projecting area projecting from the gate insulating layers IN1, IN2 in the width direction of the channel semiconductor film SC, and the lower gate electrode LG is connected to the side gate electrode SG via the projecting area. In a plan view, an area of the gate insulating layers IN1, IN2 that surrounds the channel semiconductor film SC is formed like an island. In a plan view, the outer shape of the area of the gate insulating layers IN1, IN2 that surrounds the channel region of the channel semiconductor film SC has a constant interval with the channel region in the width direction, and the side gate electrode SG is formed in contact with the outside of the outer shape.

As known from FIG. 14, the gate insulating layers IN1, IN2 are not formed on the opposite side of the side gate electrode SG from the channel semiconductor film SC, so that the lower gate electrode LG contacts the second conductive layer in the respective contact areas CA1, CA2 on the respective other sides of the side gate electrodes SG, when viewed from the channel semiconductor film SC. The respective areas of the second conductive layer are connected to the respective side gate electrodes SG in the same layer.

Third Embodiment

The following describes an organic EL display device according to a third embodiment of the present invention. In this embodiment, a structure for preventing hole accumulation is formed in the channel region. Specifically, a difference of the organic EL display device according to the third embodiment from that according to the first embodiment will be mainly described below.

Figure 15:
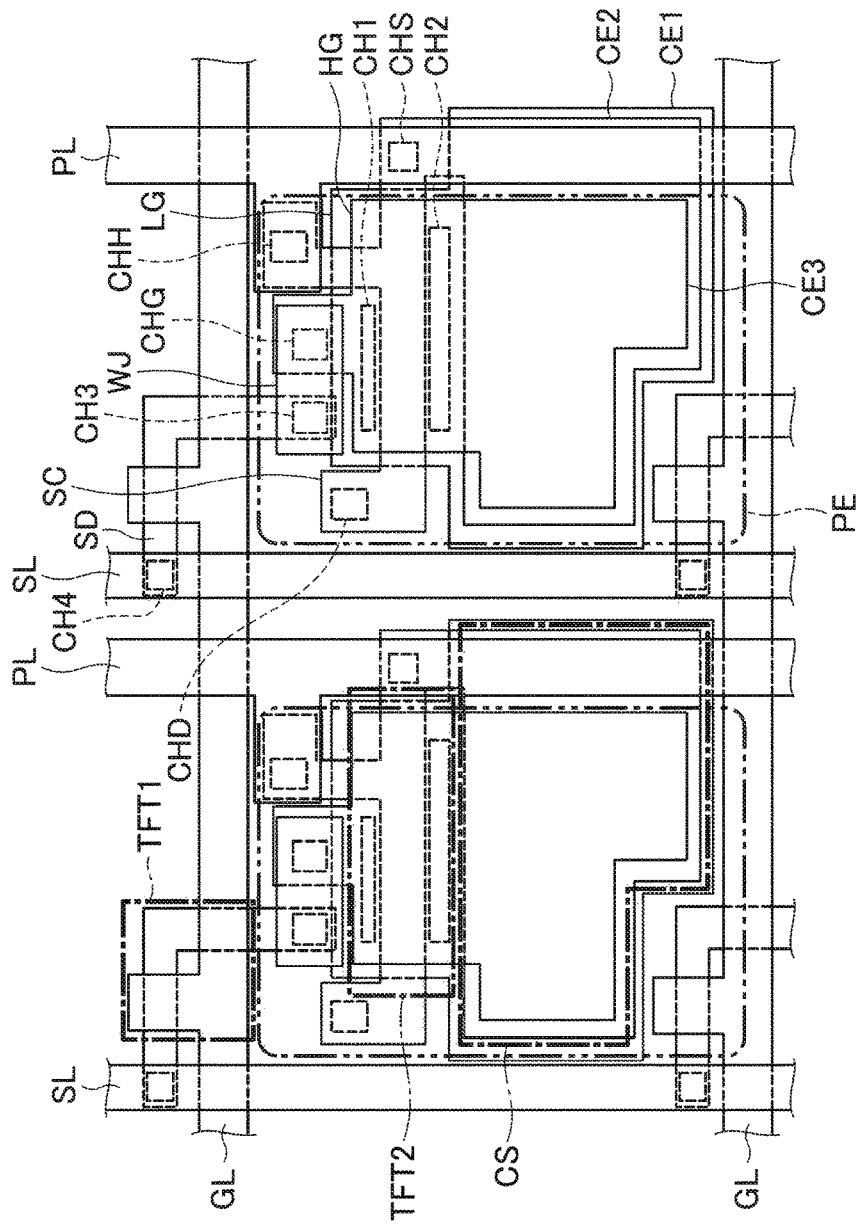
FIG. 15 is a plan view of one example of a pixel circuit according to a third embodiment.

FIG. 15 is a plan view of one example of a pixel circuit PC according to the third embodiment. In FIG. 15, a significant difference from the example in FIG. 2 lies in that the channel semiconductor film SC is branched from the channel region to extend upward as well in FIG. 15 to be electrically connected to the source region via the power supply line PL. Moreover, the contact hole CH1 is not formed on the branched part of the channel semiconductor film SC.

Figure 16:
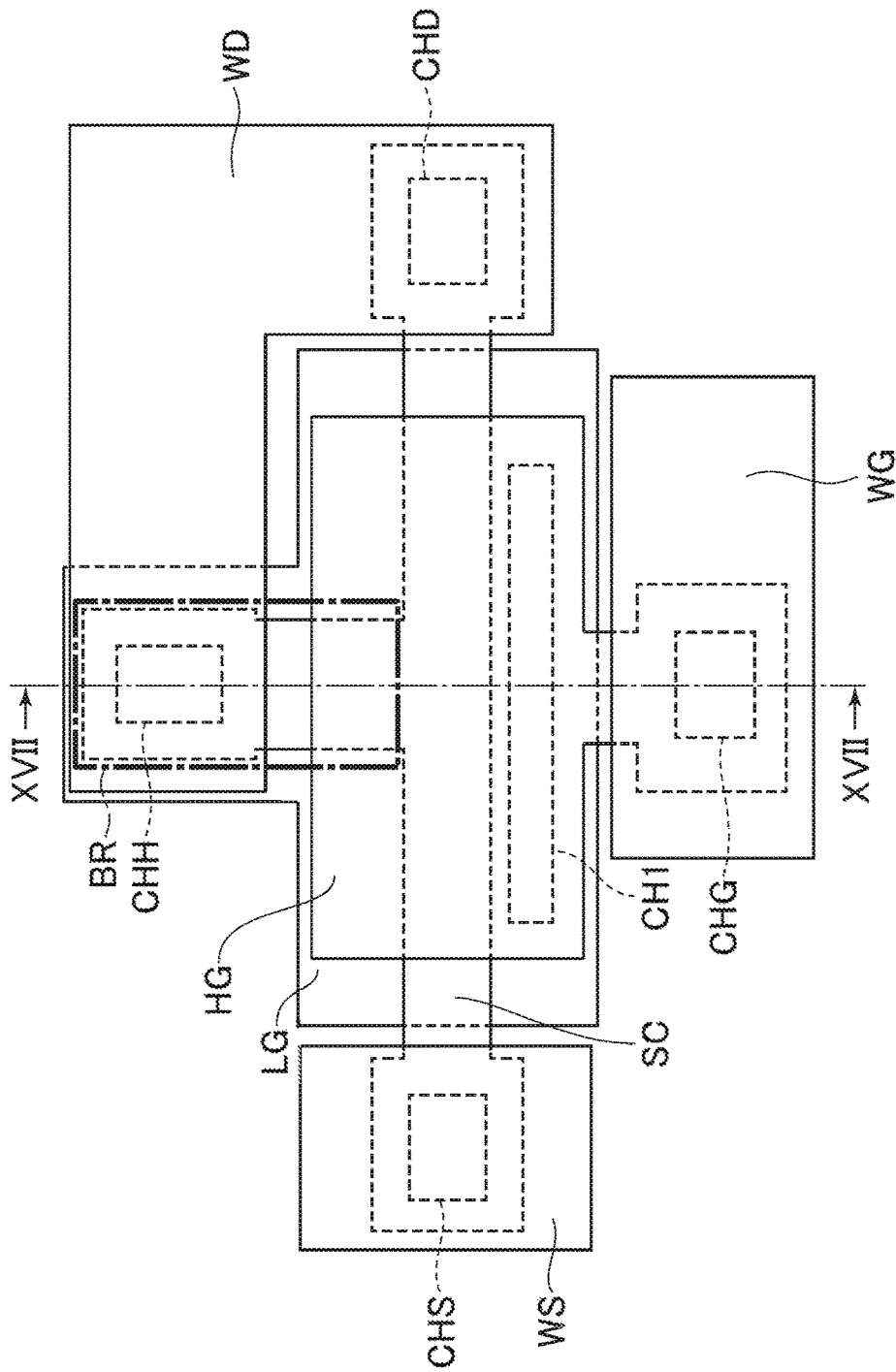
FIG. 16 is a plan view of one example of a thin film transistor according to the third embodiment.
Figure 17:
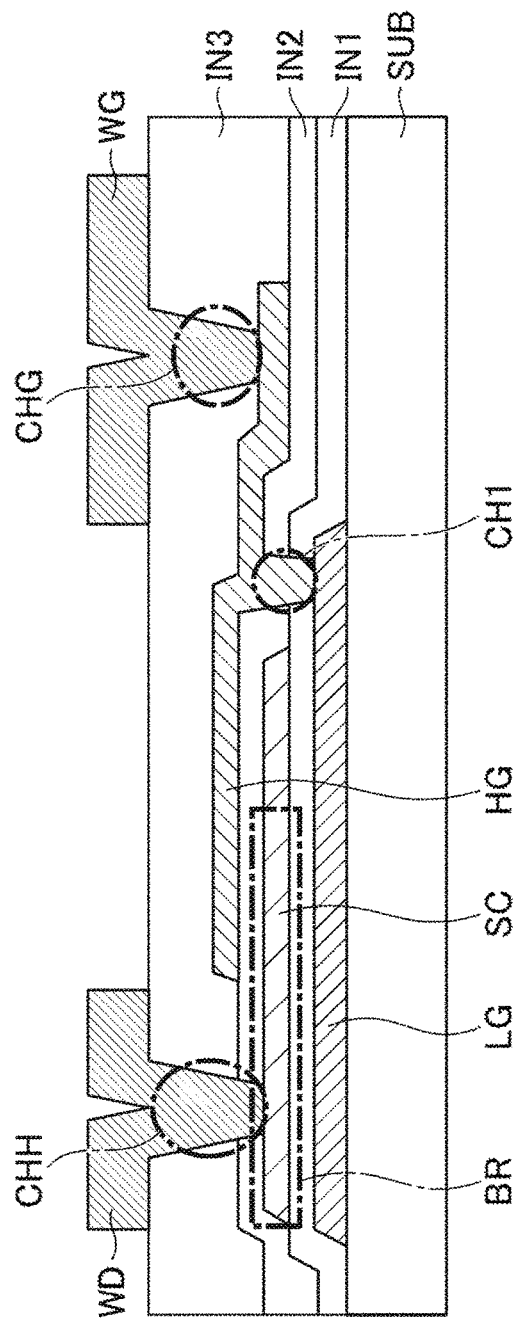
FIG. 17 is a cross sectional view of the thin film transistor illustrated in FIG. 16 along the XVII-XVII cross sectional line.

FIG. 16 is a plan view of one example of the thin film transistor TFT2 according to the third embodiment. FIG. 17 is a cross sectional view of the thin film transistor TFT2 illustrated in FIG. 16 along the XVII-XVII cross sectional line. The thin film transistor TFT2 illustrated in FIG. 16 is different from the thin film transistor TFT2 illustrated in FIG. 15 in the following four points. Firstly, the thin film transistor TFT2 illustrated in FIG. 16 does not have a part connected to the capacitor CS. Secondly, the branched part of the channel semiconductor film SC extends in a direction opposite from the contact hole CHG. Thirdly, the side gate electrode SG (a contact hole) is formed only on one side of the channel semiconductor film SC in the width direction. Fourthly, the tip end of the branched part is electrically connected to the drain region via the wire WD. Despite these differences, the thin film transistor TFT2 according to the third embodiment as well is advantageous in preventing hole accumulation. Note that the wire WS contacts the source terminal of the channel semiconductor film SC through the contact hole CHS, while the wire WG contacts the wire WG through the contact hole CHG.

In the example illustrated in FIGS. 16 and 17, the channel semiconductor film SC has a branched part BR branched from the channel region to extend in the width direction. The channel semiconductor film SC has a T-shape. The branched part BR is connected to the wire WD through the contact hole CHH, while the wire WD is connected to the drain region of the channel semiconductor film SC through the contact hole CHD. Alternatively, the branched part BR may be connected to the source region via the wire WS. The branched part BR has a channel region (referred to as a branched channel region) to which the signal potential at the gate electrode is applied. The branched channel region is branched from the channel region, and overlaps, in a plan view, the upper gate electrode HG or the lower gate electrode LG.

In the example illustrated in FIG. 16, the lower gate electrode LG has a gate branched part branched so as to be opposed to the branched part BR. With the above, the branched channel region extends to a position close to the contact hole CHH. Alternatively, the upper gate electrode HG, instead of the lower gate electrode LG, may have a gate branched part that is branched so as to be opposed to the branched part BR. Still alternatively, the lower gate electrode LG and the upper gate electrode HG may both have a gate branched part. In the example illustrated in FIG. 18, the upper gate electrode HG has a rectangular shape whose external edge is surrounded by the external edge of the lower gate electrode LG. Similar to the example illustrated in FIG. 4, in the direction in which the channel semiconductor film SC extends from the source terminal to the drain terminal, the respective both ends of the channel semiconductor film SC project from the upper gate electrode HG and the lower gate electrode LG. In a plan view, the first position at which the channel semiconductor film SC projects from the lower gate electrode LG is positioned more outward than the second position at which the channel semiconductor film SC projects from the upper gate electrode HG. Note that channel branching may be employed in other examples of the thin film transistor TFT2.

Figure 18:
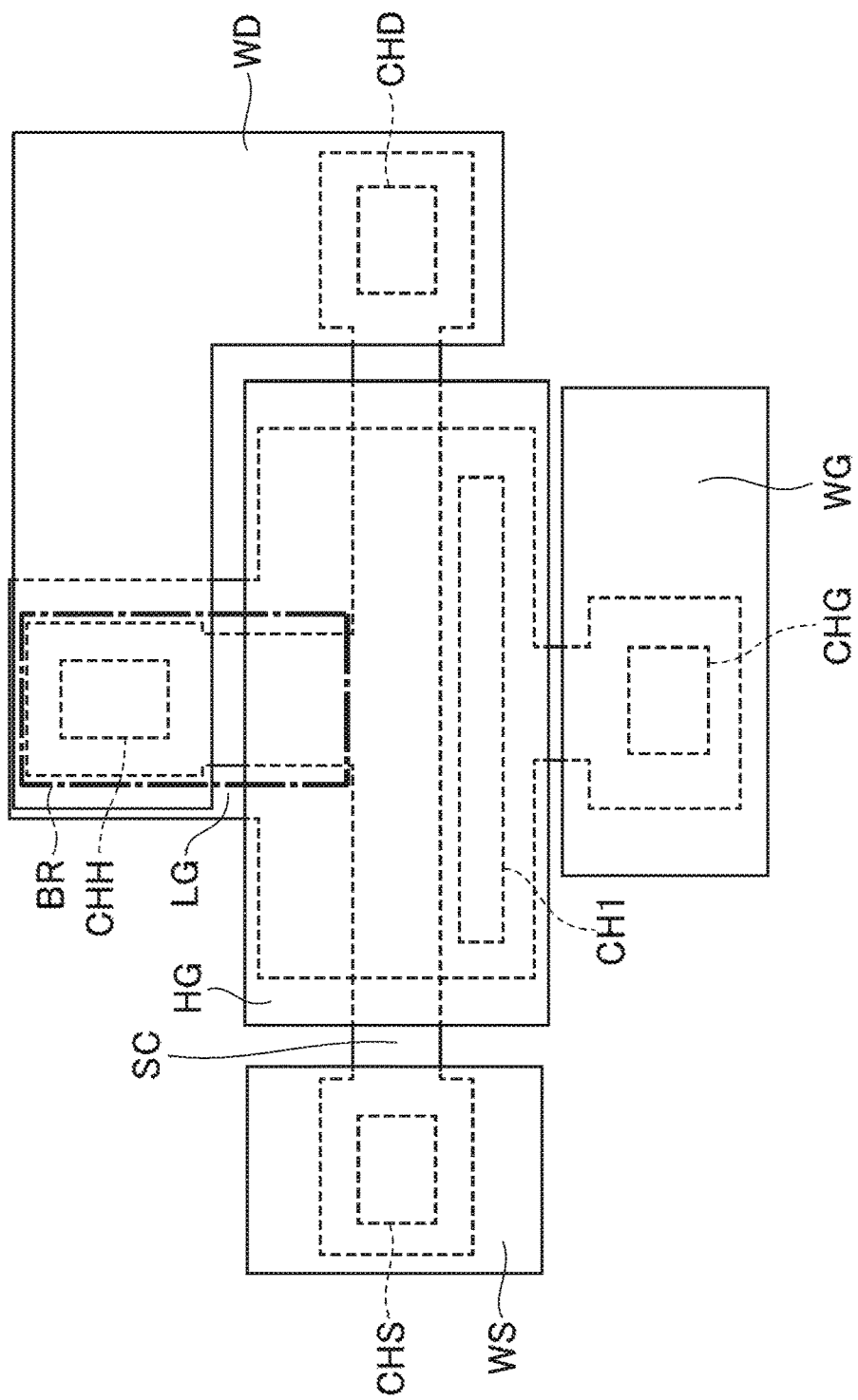
FIG. 18 is a plan view of another example of the thin film transistor.

FIG. 18 is a plan view of another example of the thin film transistor TFT2. In the example illustrated in FIG. 18, the upper gate electrode HG is formed covering a part of the lower gate electrode LG excluding the gate branched part, different from the example illustrated in FIG. 16. In the example illustrated in FIG. 18, the upper gate electrode HG has a rectangular shape whose external edge surrounds the part of the lower gate electrode LG excluding the gate branched part and the wire extending to the contact hole CHG. In a plan view, the second position at which the channel semiconductor film SC projects from the upper gate electrode HG is positioned more outward than the position at which the channel semiconductor film SC projects from the lower gate electrode LG, different from the example illustrated in FIG. 16. In the example illustrated in FIG. 18, less light hits on the channel region of the channel semiconductor film SC, as compared with the example illustrated in FIG. 16, so that the characteristics of the thin film transistor TFT2 are more stabilized.

Figure 19:
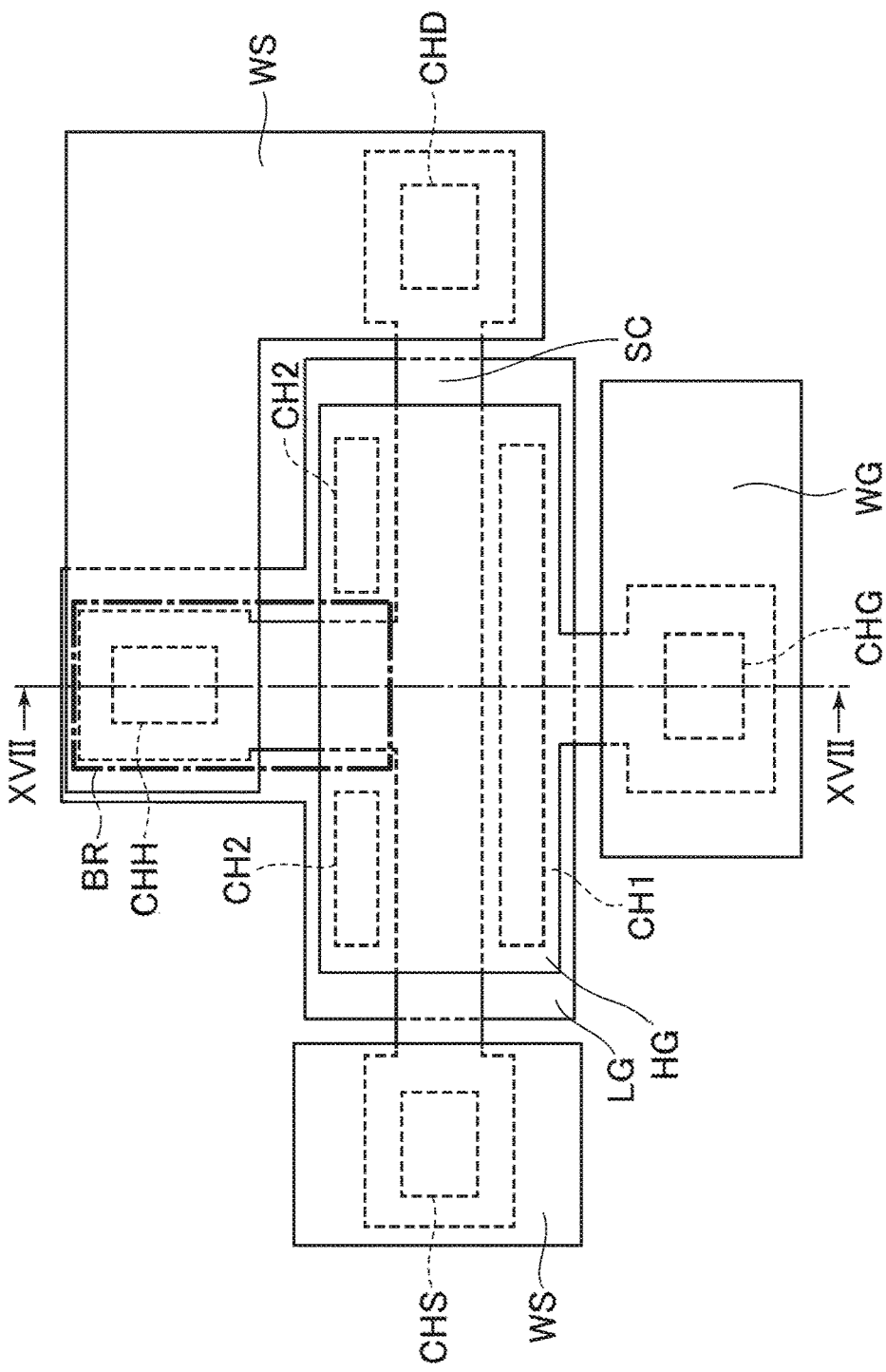
FIG. 19 is a plan view of another example of the thin film transistor.

FIG. 19 is a plan view of another example of the thin film transistor TFT2. In the example illustrated in FIG. 19, the contact hole CH2 is formed at a position closer to the contact hole CHH, when viewed from the channel region of the channel semiconductor film SC, as compared with the thin film transistor TFT2 illustrated in FIG. 16. The contact hole CH2 is formed intermittently in two respective areas but not on the branched part BR of the channel semiconductor film SC. A side gate electrode SG is formed in each contact hole CH1, CH2, so that the side gate electrodes SG are present on the respective both sides of the channel region of the channel semiconductor film SC in the width direction.

Figure 20:
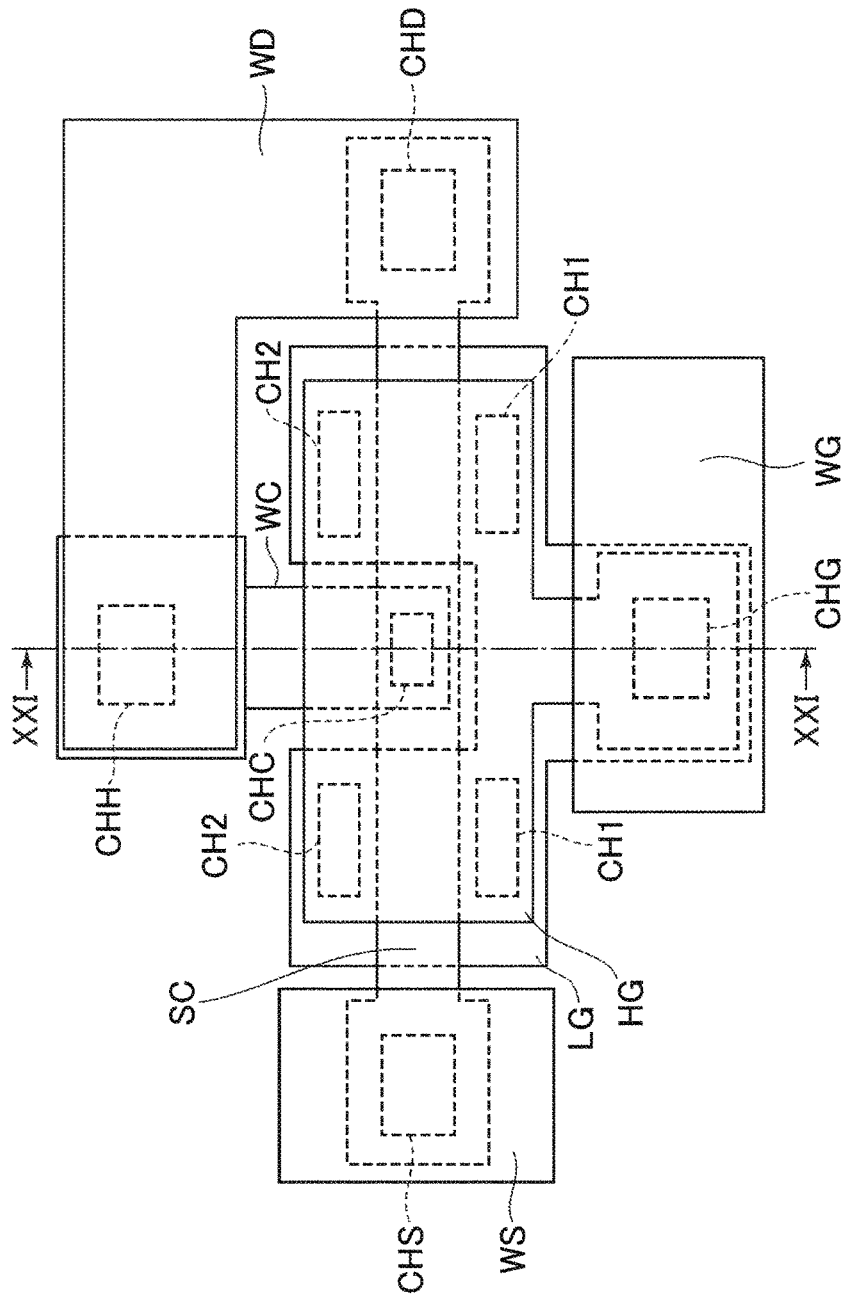
FIG. 20 is a plan view of another example of the thin film transistor.
Figure 21:
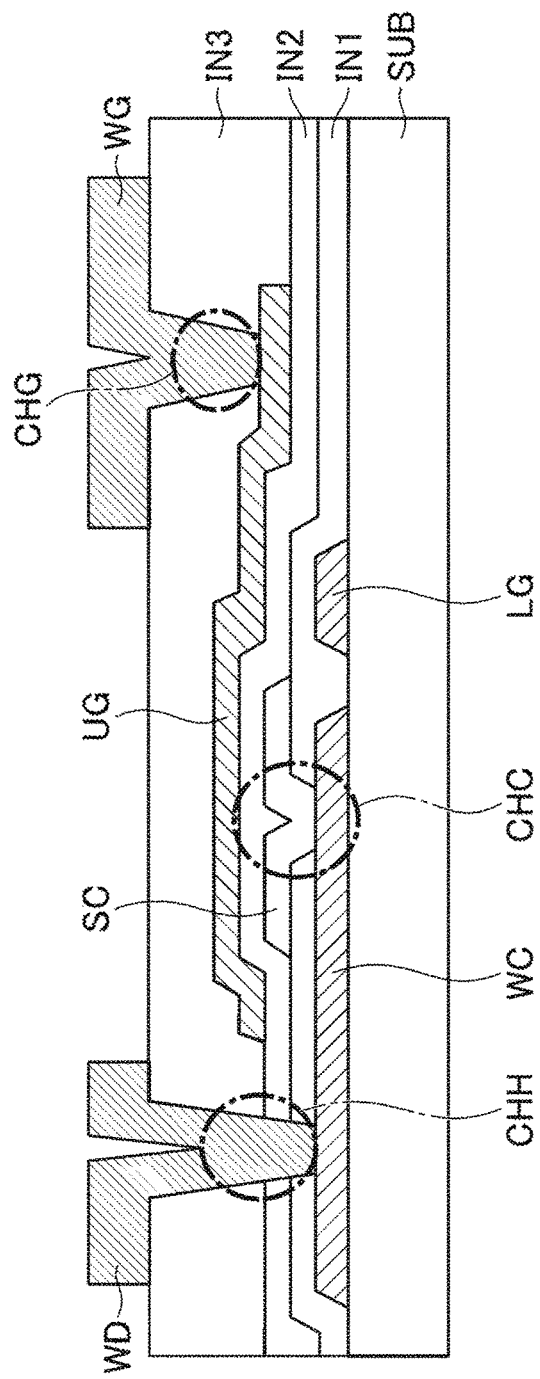
FIG. 21 is a cross sectional view of the thin film transistor illustrated in FIG. 20 along the XXI-XXI cross sectional line.

FIG. 20 is a plan view of another example of the thin film transistor TFT2. FIG. 21 is a cross sectional view of the thin film transistor TFT2 illustrated in FIG. 20 along the XXI-XXI cross sectional line. In the example illustrated in FIGS. 20 and 21, a wire for removing hot carriers is formed under the channel region, instead of the branched part BR of the channel semiconductor film SC. In the example illustrated in FIG. 20, the lower gate electrode LG has a cut-out formed therein. In a plan view, the cut-out of the lower gate electrode LG starts from the contact hole CHH side to extend toward the middle of the channel region. Meanwhile, the upper gate electrode has a rectangular shape having a cut-out formed therein starting from one side in the width direction. The area of the lower gate electrode LG opposed to the channel semiconductor film SC is divided by the cut-out into a plurality of partial areas aligned in the direction in which the channel semiconductor film SC extends. As to each partial area, the contact holes CH1, CH2 are formed sandwiching the partial area in the width direction.

In a plan view, in the area corresponding to the cut-out of the lower gate electrode LG, a wire WC in the same layer as that of the lower gate electrode LG is formed apart from the lower gate electrode LG. The wire WC extends from the contact hole CHH, which is for connecting the wire WC with the wire WD, to a position under the middle of the channel region of the channel semiconductor film SC. The wire WC contacts the lower surface of the channel semiconductor film SC through the contact hole CHC formed under the middle of the channel region to be electrically connected to the channel semiconductor film SC. The wire WC may be electrically connected to the wire WS.

Alternatively, a cut-out may be formed in the upper gate electrode HG. In this case, in a plan view, the cut-out of the upper gate electrode HG is made starting from the contact hole CHH side to extend toward the position at the middle of the channel region. The upper gate electrode HG has a shape corresponding to the two-dimensional shape of the lower gate electrode LG illustrated in FIG. 20. That is, the upper gate electrode HG has a rectangular shape having a cut-out formed therein starting from one side thereof in the width direction and a part extending from one side in the width direction toward the wire WG. In the area corresponding to the cut-out of the upper gate electrode HG, a wire WC in the same layer as the upper gate electrode HG is formed extending from the contact hole CHH, which is for connecting the wire WC with the wire WD, to a position over the middle of the channel region of the channel semiconductor film SC. The wire WC contacts the upper surface of the channel semiconductor film SC through the contact hole CHC formed at a position over the middle of the channel region to be electrically connected to the channel semiconductor film SC.

In the above described plurality of embodiments of the present invention, an oxide film may be formed by using a laser, for example, on the front and lateral surfaces of the channel semiconductor film SC to thereby form a gate insulating layer. This structure is able to accurately control the film thickness as to the lateral surface of the channel semiconductor film SC, and thus to increase a manufacturing margin more than that which is achieved using a method in which a contact hole is formed.

The invention claimed is:
1. A display device, comprising:
  thin film transistors each provided to each of a plurality of pixels arranged in a matrix, wherein
  each of the thin film transistors includes
    a semiconductor layer, a first insulating layer formed under the semiconductor layer, a second insulating layer formed over the semiconductor layer, and a gate electrode opposed to the semiconductor layer and separated from the semiconductor layer, the semiconductor layer includes a source region, a drain region, a channel region between the source region and the drain region, an upper surface, a lower surface, and a lateral surface connected to the upper surface and the lower surface and having a part contained in the channel region, the gate electrode includes a first gate electrode portion opposed to the lower surface of the semiconductor layer via the first insulating layer, a second gate electrode portion opposed to the upper surface of the semiconductor layer via the second insulating layer, and a third gate electrode portion opposed to the lateral surface of the semiconductor layer, and contacting the first gate electrode portion and the second gate electrode portion, the second gate electrode portion has an overlapping part overlapping with the semiconductor layer and the third gate electrode portion in a plan view and a protruding part touching with the overlapping part without overlapping the semiconductor layer and third gate electrode portion in the plan view, the overlapping part has a distance between a first side crossing two sides of the semiconductor layer in the plan view and a second side parallel to the first side and crossing the two sides of the semiconductor layer in the plan view, a width of the protruding part measured from a first side of the protruding part parallel to the first side of the overlapping part to a second side of the protruding part parallel to the second side of the overlapping part is smaller than the distance, a laminated part where the first insulating layer and the second insulating layer are stacked each other is located around the semiconductor layer, and a part of the laminated part is positioned between the lateral surface of the semiconductor layer and the third gate electrode portion.

2. The display device according to claim 1, wherein the semiconductor layer includes a first part overlapping, in the plan view, either one of the first gate electrode and the second gate electrode portion, and a second part projecting, in the plan view, from the first part to a side opposite from the semiconductor layer, and overlapping neither the first gate electrode nor the second gate electrode portion.

3. The display device according to claim 1, wherein the channel region of the semiconductor layer includes a pair of first overlapping areas overlapping, in the plan view, both of the first gate electrode portion and the second gate electrode portion, and a pair of second overlapping areas overlapping, in the plan view, either one of the first gate electrode portion and the second gate electrode portion, the pair of first overlapping areas are opposed to each other in a direction from the source region to the drain region, and each of the pair of second overlapping areas is positioned adjacent to each of the pair of first overlapping areas in the pair.

4. The display device according to claim 1, wherein one of the first gate electrode portion and the second gate electrode portion has a cut-out hollowing in a direction intersecting a direction from the source region to the drain region, and a part of the semiconductor layer is positioned in a non-overlapping area positioned inside the cut-out and not overlapping, in the plan view, the one of the first gate electrode portion and the second gate electrode portion.

5. The display device according to claim 4, wherein a wire is positioned in the non-overlapping area, and the wire is electrically connected to the semiconductor layer at a surface opposed to one of the upper surface and the lower surface.

6. The display device according to claim 5, wherein the wire is electrically connected to one of the source region and the drain region.

7. The display device according to claim 1, wherein the laminated part has a contact hole formed at a position opposed to the lateral surface of the semiconductor layer, and the third gates electrode portion is formed in the contact hole.

8. The display device according to claim 7, wherein the first gate electrode portion has a first area opposed to the semiconductor layer, the second gate electrode portion has a second area opposed to the semiconductor layer, the contact hole has a pair of end portions positioned in a direction from the source region to the drain region, and the pair of end portions of the contact hole overlap, in the plan view, one of the first area and the second area and do not overlap an other of the first area and the second area.

9. The display device according to claim 1, wherein the first gate electrode portion has a projecting area projecting from the first insulating layer and the second insulating layer in the plan view, and the third gate electrode portion is connected to the first gate electrode portion via the projecting area.

10. The display device according to claim 1, wherein the first insulating layer and the second insulating layer are not in contact with an opposite surface of the third gate electrode portion from the semiconductor layer.

11. The display device according to claim 1, wherein the third gate electrode portion has a pair of end portions positioned in a direction from the source region to the drain region, and the pair of end portions of the third gate electrode portion overlap, in the plan view, the first gate electrode portion and the second gate electrode portion.

12. The display device according to claim 11, wherein the first gate electrode portion has a first area opposed to the semiconductor layer, the second gate electrode portion has a second area opposed to the semiconductor layer, the third gate electrode portion has a third area opposed to the semiconductor layer, the third area has a pair of end portions positioned on respective both sides in the direction from the source region to the drain region, and the pair of end portions of the third area overlap, in the plan view, the first area and the second area.

13. The display device according to claim 1, wherein the lateral surface of the semiconductor layer includes a first lateral surface and a second lateral surface opposed to the first lateral surface via the channel region, and the third gate electrode portion is opposed to both of the first lateral surface and the second lateral surface.

14. The display device according to claim 1, wherein the lateral surface of the semiconductor layer includes a first lateral surface and a second lateral surface opposed to the first lateral surface via the channel region, and the third gate electrode portion is opposed to either one of the first lateral surface and the second lateral surface.

15. The display device according to claim 1, wherein the lateral surface of the semiconductor layer includes a first lateral surface and a second lateral surface opposed to the first lateral surface via the channel region, and the third gate electrode portion includes a plurality of first separated parts separated from each other and opposed to the first lateral surface.

16. The display device according to claim 15, wherein the third gate electrode portion includes a plurality of second separated parts separated from each other and opposed to the second lateral surface.

17. The display device according to claim 1, wherein the semiconductor layer has a branched part that is branched to extend from one of the two sides of the semiconductor layer in a direction intersecting a direction from the source region to the drain region, the branched part has a width in the direction from the source region to the drain region from a first side of the branched part to a second side of the branched part that is smaller than an entire length in the direction from the source region to the drain region of the one of the two sides of the semiconductor from which it extends, and the branched part is branched from the channel region.

18. The display device according to claim 17, wherein at least one of the first gate electrode portion and the second gate electrode portion includes a branched gate electrode portion opposed to the branched part.

19. The display device according to claim 17, wherein the branched part is electrically connected to one of the source region and the drain region.

20. The display device according to claim 1, wherein the overlapping part and the protruding part together form a T-shape in the plan view.

* * * * *